(12) United States Patent
Shim

(10) Patent No.: US 8,929,149 B2
(45) Date of Patent: Jan. 6, 2015

(54) SEMICONDUCTOR MEMORY DEVICE AND METHOD OF OPERATING THE SAME

(75) Inventor: Keon Soo Shim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 230 days.

(21) Appl. No.: 13/600,911

(22) Filed: Aug. 31, 2012

(65) Prior Publication Data

US 2014/0043914 A1    Feb. 13, 2014

(30) Foreign Application Priority Data

Aug. 8, 2012    (KR) .......................... 10-2012-0086905

(51) Int. Cl.
 *G11C 11/34*    (2006.01)
(52) U.S. Cl.
 USPC ............. 365/185.22; 365/185.18; 365/185.29
(58) Field of Classification Search
 CPC ........ G11C 16/26; G11C 16/14; G11C 16/16; G11C 16/3445; G11C 11/5635; G11C 13/0097; G11C 16/344; G11C 16/00
 USPC .................. 365/185.22, 185.29, 218, 185.19, 365/185.18, 185.03, 185.3
 See application file for complete search history.

(56) References Cited

U.S. PATENT DOCUMENTS

| | | | | |
|---|---|---|---|---|
| 6,385,090 | B1* | 5/2002 | Kitazaki | 365/185.18 |
| 2009/0244969 | A1* | 10/2009 | Maejima | 365/185.03 |
| 2010/0020607 | A1* | 1/2010 | Melik-Martirosian | 365/185.3 |
| 2012/0051143 | A1* | 3/2012 | Yoon et al. | 365/185.22 |

FOREIGN PATENT DOCUMENTS

| | | |
|---|---|---|
| KR | 100781041 | 11/2007 |
| KR | 1020110065759 | 6/2011 |

* cited by examiner

*Primary Examiner* — Richard Elms
*Assistant Examiner* — Ajay Ojha
(74) *Attorney, Agent, or Firm* — IP & T Group LLP

(57) ABSTRACT

The semiconductor memory device includes a memory cell block including a plurality of memory cells, a peripheral circuit section configured to perform an erase loop including a supply operation supplying an erase voltage and an erase verification operation to erase data stored in the memory cells, a fail bit counter configured to count the number of memory cells not erased in an erase operation among the memory cells to generate a count signal based on a fail count corresponding to a counting result in the erase verification operation, and a controller configured to control the peripheral circuit section to set a new erase voltage by increasing an erase voltage, used in a previous erase loop, by a first step voltage or decreasing the erase voltage by a second step voltage based on the fail count, and perform the erase loop using the new erase voltage.

16 Claims, 4 Drawing Sheets

SEMICONDUCTOR MEMORY DEVICE AND METHOD OF OPERATING THE SAME

CROSS-REFERENCE TO RELATED APPLICATION

Priority is claimed to Korean patent application number 10-2012-0086905 filed on Aug. 8, 2012, the entire disclosure of which is incorporated herein by reference in its entirety.

BACKGROUND

Embodiments of the present invention relate to a semiconductor memory device and a method of operating the same, more particularly relate to a semiconductor memory device having a charge trap type memory cell and a method of operating the same.

A non-volatile memory device of a semiconductor memory device has characteristics that data is not erased even though a power is not supplied. A charge trap type flash memory device of the non-volatile memory device stores data by using a memory cell where a tunnel dielectric layer, a charge trap layer, a blocking dielectric layer and a gate conductive layer are laminated on a semiconductor substrate. The charge trap type flash memory device charges electric charges in the charge trap layer in case that a high voltage is supplied to a gate of the memory cell in a program operation. A threshold voltage of the memory cell varied depending on amount of the electric charges charged in the charge trap layer is detected in a read operation, and the stored data is determined based on level of the detected threshold voltage.

The memory cell in the non-volatile memory device is a device that may perform a program operation/an erase operation, and the program operation and the erase operation are performed by changing the threshold voltage of the memory cell.

FIG. 1 is a flowchart illustrating an erase operation of a conventional semiconductor memory device.

In FIG. 1, a semiconductor memory device performs the erase operation that uses an incremental step pulse erase ISPE method.

Particularly, an erase voltage is supplied to a p-well of a semiconductor substrate on which memory cells are formed in step S1. Subsequently, an erase verification operation is performed for verifying whether or not threshold voltage of every memory cell is less than a target threshold voltage in steps S2 and S3. In case that it is verified that the threshold voltage of every memory cell is less than the target threshold voltage, it is determined that an erase operation is passed, and thus, the erase operation is finished. In case that it is verified that threshold voltage of one or more memory cell is higher than the target threshold voltage, it is determined that the erase operation is failed. In case that it is determined through the erase verifying operation that the erase operation is failed, a voltage increased by step voltage from an erase voltage supplied in previous operation of supplying the erase voltage is set to new erase voltage in step S4. The step S1 and following steps are performed again by using the new erase voltage.

FIG. 2 is view illustrating a graph for showing change of threshold voltage in an erase operation of a conventional semiconductor memory device.

In FIG. 2, the erase operation using the ISPE method is performed by repeating an erase loop (the steps S1 to S4), and so the erase voltage increased step-by-step is supplied to the p-well of the semiconductor substrate. However, a back tunneling phenomenon occurs through a blocking dielectric layer in case that the erase voltage increases to a voltage more than constant voltage in the charge trap type memory cell, and thus, the threshold voltage of the memory cell may increase again. For example, the threshold voltage of the memory cell lowers gradually in case that the erase voltage is supplied in sequence to A, A+1, A+2, but the threshold voltage of the memory cell may increase due to the back tunneling phenomenon through the blocking dielectric layer in case that the erase voltage boosts to A+3.

Accordingly, threshold voltage distribution of the memory cell may lack uniformity even though the erase loop is performed repeatedly using the ISPE method, and the erase operation may fail because the threshold voltage of the memory cell is not erased to a voltage less than the target threshold voltage.

SUMMARY OF THE INVENTION

Exemplary embodiments of the present invention provide a semiconductor memory device for erasing threshold voltages of memory cells to a voltage less than a target threshold voltage in an erase operation so that fail of the erase operation is prevented, and a method of operating the same.

A semiconductor memory device according to an exemplary embodiment of the present invention includes a memory cell block including a plurality of memory cells, a peripheral circuit section configured to perform an erase loop including a supply operation supplying an erase voltage and an erase verification operation to erase data stored in the memory cells, a fail bit counter configured to count the number of memory cells not erased in an erase operation among the memory cells to generate a count signal based on a fail count corresponding to a counting result in the erase verification operation, and a controller configured to control the peripheral circuit section to set a new erase voltage by increasing an erase voltage, used in a previous erase loop, by a first step voltage or decreasing the erase voltage by a second step voltage based on the fail count, and perform the erase loop using the new erase voltage.

A method of operating a semiconductor memory device according to an exemplary embodiment of the present invention includes supplying an erase voltage to a p-well of a semiconductor substrate on which memory cells are formed, performing an erase verification operation on the memory cells, generating a fail count by counting the number of memory cells not erased in an erase operation among the memory cells, and setting a voltage, obtained by increasing the erase voltage by a first step voltage, to a new erase voltage when the fail count is less than a previous fail count, setting a voltage, obtained by decreasing the erase voltage by a second step voltage, to the new erase voltage when the fail count is greater than the previous fail count, and returning to an operation of is supplying the erase voltage.

A method of operating a semiconductor memory device according to another exemplary embodiment of the present invention includes supplying an erase voltage to a p-well of a semiconductor substrate on which memory cells are formed, performing a first erase verification operation on the memory cells, generating a fail count by counting the number of memory cells not erased in an erase operation among the memory cells, comparing the fail count with a previous fail count, setting a first erase voltage by increasing the first erase voltage by a first step voltage when the fail count is less than the previous fail count, and returning to an operation of supplying the first erase voltage and repeating the operation of supplying the first erase voltage and following operations using the first erase voltage, setting a second erase voltage by decreasing the first erase voltage by a second step voltage when the fail count is greater than or equal to the previous fail count, supplying the second erase voltage to the p-well, performing a second erase verification operation on the memory cells, and decreasing the second erase voltage by the second step voltage when the result of the first erase verification operation is determined as fail, and returning to an operation of supplying the second erase voltage and repeating the operation of supplying the second erase voltage and following operations using the second erase voltage.

A semiconductor memory device of the present invention optimizes an erase voltage in an erase operation so that threshold voltages of memory cells are erased to a voltage less than a target threshold voltage, thus, failures of the erase operation may be prevented.

BRIEF DESCRIPTION OF THE DRAWINGS

The above and other features and advantages of various embodiments of the present invention will become readily apparent by reference to the following detailed description when considered in conjunction with the accompanying drawings wherein.

DESCRIPTION OF SPECIFIC EMBODIMENTS

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
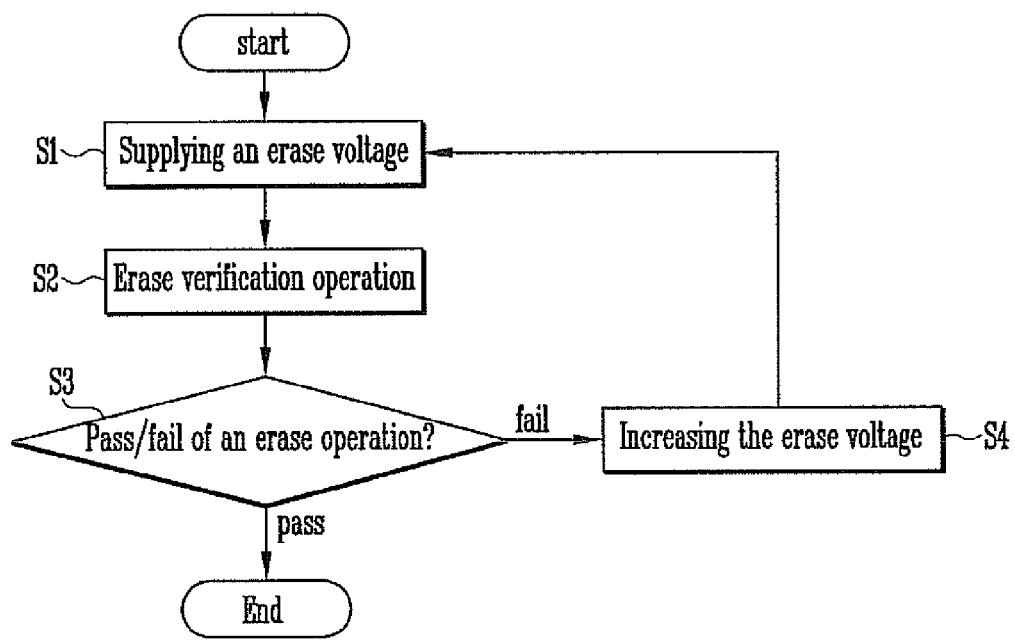
FIG. 1 is a flowchart illustrating an erase operation of a conventional semiconductor memory device.
Figure 2:
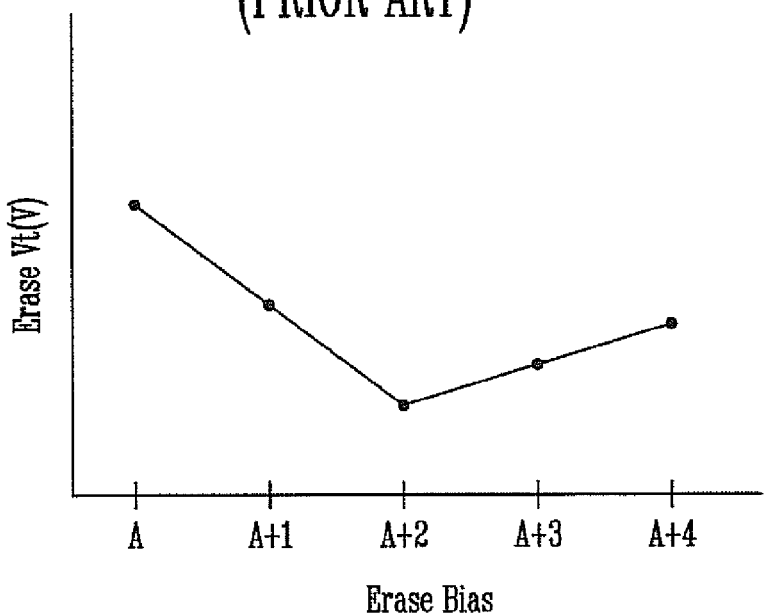
FIG. 2 is view illustrating a graph for showing change of threshold voltage in an erase operation of a conventional semiconductor memory device.
Figure 3:
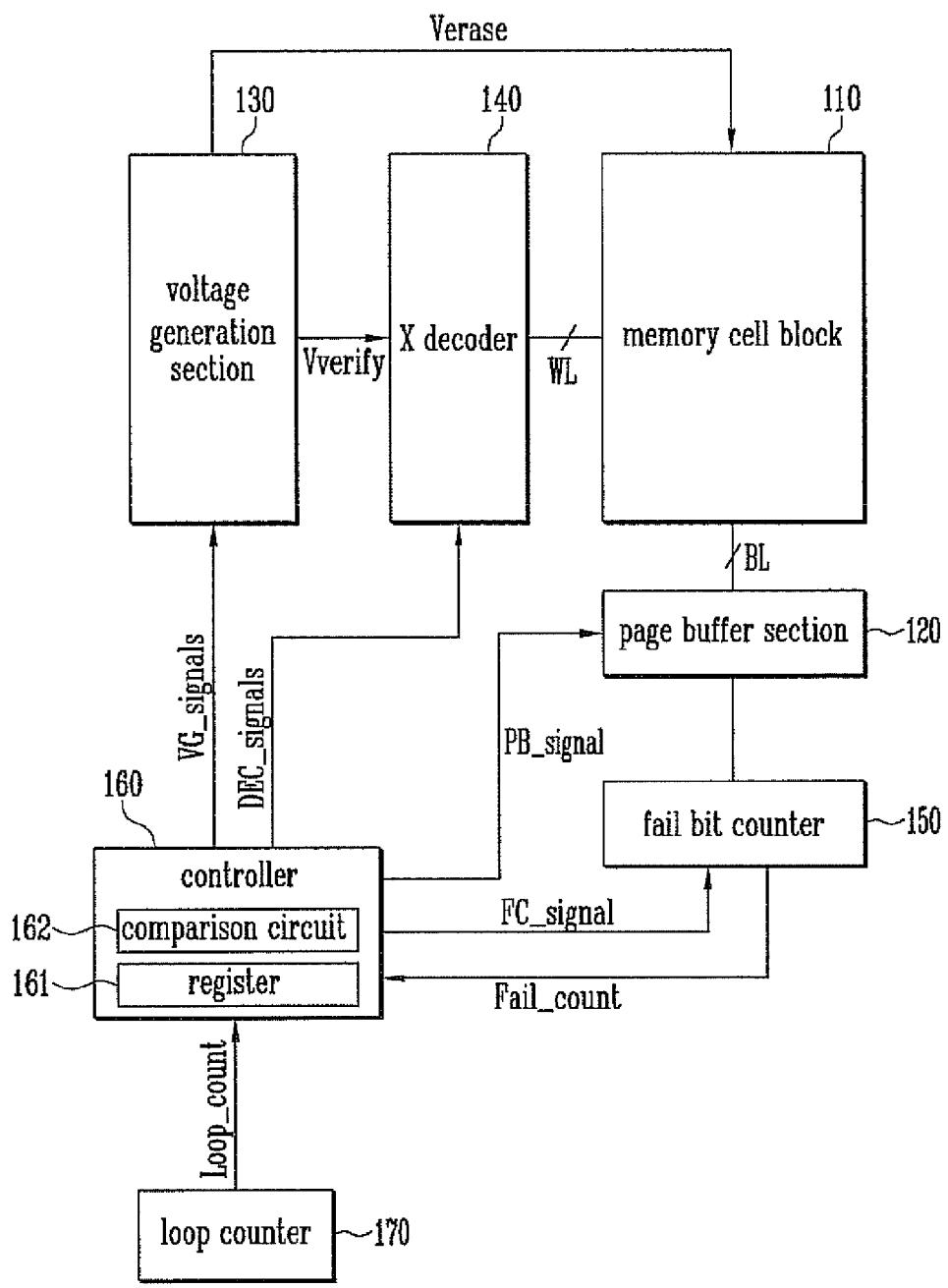
FIG. 3 is a block diagram illustrating a semiconductor memory device according to an embodiment of the present invention.

FIG. 3 is a block diagram illustrating a semiconductor memory device according to an exemplary embodiment of the present invention.

In FIG. 3, a semiconductor memory device 1000 includes a memory cell block 110, a page buffer section 120, a voltage generation section 130, an X decoder 140, a fail bit counter 150, a controller 160 and a loop counter 170.

The memory cell block 110 includes plural memory cells. For example, the memory cells may be charge trap type memory cells. The memory cells are formed on the same p-well of a semiconductor substrate.

The page buffer section 120 is connected to plural bit lines BL of the memory cell block 110. The page buffer section 120 senses threshold voltages of the memory cells in the memory cell block 110 in response to page buffer control signals PB_signals generated by the controller 160 in an erase verification operation, and determines through the sensed result whether or not corresponding erase operation is passed or failed.

The voltage generation section 130 generates an erase voltage Verase in response to voltage generation control signals VG_signals generated by the controller 160 when the erase operation is performed, and generates a verifying voltage Vverify in an erase verification operation.

The X decoder 140 supplies selectively the verification voltage Vverify generated by the voltage generation section 130 in the erase verification operation to word lines WL of the memory cell block 110 in response to decoder control signals DEC_signals generated by the controller 160.

The fail bit counter 150 counts total number of memory cells determined as failed memory cell by the page buffer section 120 in the erase verification operation in response to fail bit counter control signals FC_signals generated by the controller 160. The fail bit counter 150 generates fail count Fail_count based on the counted result, and transmits the generated fail count Fail_count to the controller 160.

The controller 160 generates the control signals PB_signals, VG_signals, DEC_signals, FC_signals for controlling the page buffer section 120, the voltage generation section 130, the X decoder 140 and the fail bit counter 150 in the erase operation and the erase verification operation. In addition, the controller 160 compares fail count Fail_count of current erase loop outputted from the fail bit counter 150 with fail count Fail_count of previous erase loop in the erase verification operation, and sets an erase voltage to be used in next erase loop based on the compared result. Particularly, in case that the fail count Fail_count of the current erase loop is less than that of the previous erase loop based on the compared result, new erase voltage is set by increasing an erase voltage Verase used in the previous erase loop by a first step voltage. In case that the fail count Fail_count of the current erase loop is higher than or the same as that of the previous erase loop, new erase voltage is set by reducing the erase voltage Verase used in the previous erase loop by a second step voltage. The controller 160 determines that threshold voltage distribution of the memory cell increases due to back tunneling effect through a blocking dielectric layer in case that the fail count Fail_count of the current erase loop is higher than that of the previous erase loop, and thus, reduces the erase voltage Verase to inhibit the back tunneling effect.

The controller 160 includes a register 161 and a comparison circuit 162, and may store the fail count Fail_count transmitted from the fail bit counter 150 in the register 161. The comparison circuit 162 compares the fail count Fail_count counted in the previous erase loop with the fail count Fail_count counted in the current erase loop.

Furthermore, the controller 160 detects whether or not performance number of the current erase loop is less than allowable preset maximum loop number in response to a loop count signal Loop_count outputted from the loop counter 170, and determines whether or not the erase operation should be finished based on the detected result.

The loop counter 170 generates a loop count signal Loop_count by counting the performance number of the current erase loop, and outputs the generated loop count signal Loop_count to the controller 160.

The page buffer section 120, the voltage generation section 130 and the X decoder 140 may be defined as a peripheral circuit section.

Figure 4:
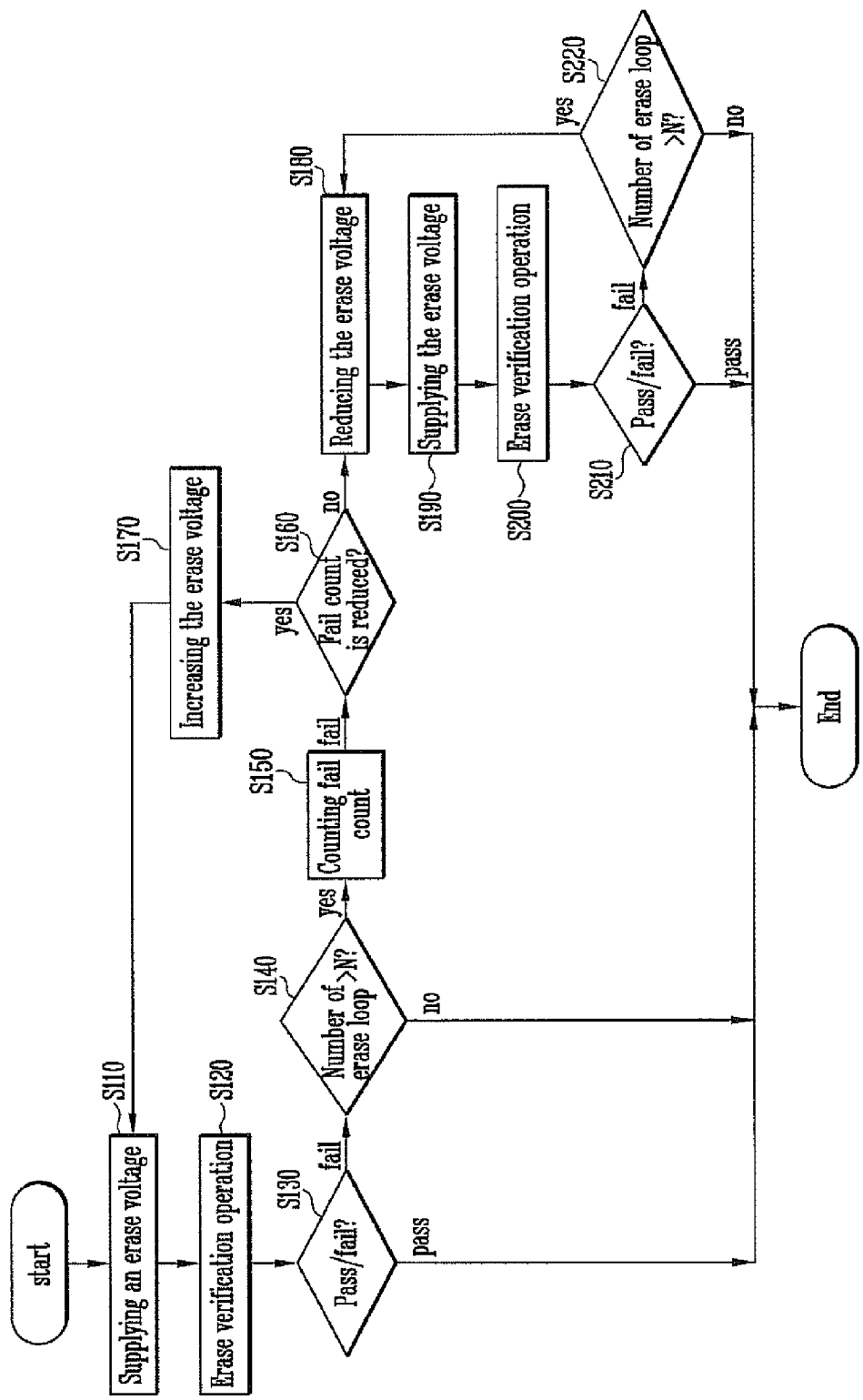
FIG. 4 is a flowchart illustrating an erase operation of a semiconductor memory device according to an embodiment of the present invention.

FIG. 4 is a flowchart illustrating an erase operation of a semiconductor memory device according to an exemplary embodiment of the present invention.

The erase operation of the semiconductor memory device of the present invention will be described in detail with reference to accompanying drawings FIG. 3 and FIG. 4.

1) Operation of supplying an erase voltage in Step S110 the voltage generation section 130 generates an erase voltage Verase used in the current erase loop in response to the voltage generation control signals VG_signals outputted from the controller 160. The generated erase voltage Verase is supplied to the p-well of the semiconductor substrate where the memory cell block 110 is formed. Here, 0V is supplied to word lines of the memory cell block 110.

As a result, electric charges trapped in charge trap layers of programmed memory cells in the memory cell block 110 are discharged to the semiconductor substrate through a tunnel dielectric layer, and thus, threshold voltages of the memory cells become lower.

2) Erase Verification Operation in Step S120

It is verified whether or not the threshold voltages of the memory cells in the memory cell block 110 are lower than the target threshold voltage, e.g. —1V by using the page buffer section 120 connected to bit lines BL of the memory cell block 110 after the step S110 is performed. For example, the erase verification operation may verify the erase operation by sensing the threshold voltages of the memory cells using a virtual negative read (VNR) method. Particularly, a pass voltage supplied to the word line not selected in the operation of sensing the threshold voltages of the memory cells, a bit line voltage and voltages supplied to the p-well are increased by a core voltage Vcore, e.g. 1V and the increased voltages are supplied. Accordingly, the threshold voltage of the memory cell may be sensed as a voltage increased by the core voltage Vcore even though real threshold voltage has negative voltage, e.g. −1V.

The steps S110 and S120 are performed in sequence, and they are defined as one erase loop.

3) Pass or Fail Checking in Step S130

In case that it is verified that the threshold voltage of every memory cell is lower than the target threshold voltage according to the step S120, the erase operation is passed, and so the erase operation is finished. In case that it is verified that the threshold voltage of at least one memory cell is higher than the target threshold voltage, the erase operation is failed.

4) Verifying Number of the Erase Loop in Step S140

In case that the erase operation is failed based on the step S130, the loop counter 170 counts the number of the erase loop performed presently, and outputs a loop count signal Loop_count based on the counted result to the controller 160. The controller 160 detects whether or not the number N of the erase loop performed presently is less than an allowable maximum loop number in response to the loop count signal Loop_count, and determines whether or not the erase operation is finished based on the detected result. For example, in case that the number N of the erase operation performed presently is less than the allowable maximum loop number, next algorism is performed.

5) Counting Fail Count in Step S150

In case that the number N is less than the allowable maximum loop number based on the step S140, the page buffer section 120 detects pass or fail of the erase operation for each of the memory cells, and the fail bit counter 150 counts the number of failed memory cells and transmits the fail count Fail_count in accordance with the counted result to the controller 160.

6) Comparing Fail Count in Step S160

The controller 160 detects whether or not the fail count Fail_count is increased or decreased by comparing the fail count Fail_count counted in current erase loop with the fail count Fail_count counted in previous erase loop. In case that the current erase loop is a first erase loop, the above operation of comparing the fail count may be skipped. The present fail count may be stored in the register of the controller 160.

7) Increasing an Erase Voltage in Step S170

If it is determined that the fail count Fail_count of the current erase loop is less than that of the previous erase loop based on the step S160, the controller 160 increases the erase voltage by a first step voltage and sets the increased erase voltage as a new erase voltage. Subsequently, the step S110 and following steps are performed again by using the new erase voltage.

The steps S110 to S170 are defined as a first erase loop. That is, one first erase loop is defined as the steps from the step S110 to the step before the step S110 performed again.

8) Reducing the Erase Voltage in Step S180

The controller 160 reduces the erase voltage by a second step voltage in case that the fail count Fail_count of the current erase loop is higher than that of the previous erase loop according to the step S160, and sets the reduced erase voltage as a new erase voltage.

In case that the fail count Fail_count of the current erase loop is higher than that of the previous erase loop, the controller 160 determines that the threshold voltage of the memory cell increases, because electric charges are discharged through a blocking dielectric layer due to excessive increase of the erase voltage, and reduces the erase voltage based on the determined result.

9) Operation Supplying the Erase Voltage in Step S190

The voltage generation section 130 generates new erase voltage Verase reduced by the second step voltage from the erase voltage used in the previous erase loop in response to the voltage generation control signals VG_signals outputted from the controller 160. Here, the second step voltage is lower than or the same as the first step voltage. Because the operation supplying the erase voltage is similar to the step S110, any further description concerning the operation will be omitted.

10) Erase Verification Operation in Step S200

It is verified whether or not the threshold voltages of the memory cells in the memory cell block 110 are lower than the target threshold voltage, e.g.—1V, by using the page buffer section 120 connected to the bit lines BL of the memory cell block 110 after the step S190 is performed. For example, the erase verification operation may sense the threshold voltages of the memory cells using the VNR method and may verify the erase operation according to the sensed result.

11) Checking Pass/Fail in Step S210

In case that it is verified that the threshold voltage of every memory cell are lower than the target threshold voltage based on the step S200, the erase operation is passed, and thus, the erase operation is finished. In case that it is verified that the threshold voltage of at least one memory cell is higher than the target threshold voltage, the erase operation is failed.

12) Verifying the Number of the Erase Loop in Step S220

If the erase operation is failed based on the step S210, the loop counter 170 counts the number of the erase loop performed presently and outputs the loop count signal Loop_count in accordance with the counted result to the controller 160. The controller 160 detects whether or not the number N of the erase loop performed presently is less than allowable preset maximum loop number in response to the loop count signal Loop_count, and determines whether or not the erase operation is finished based on the detected result. If the number N is higher than or the same as the allowable maximum loop number, the erase operation is finished. However, if the number N is less than the allowable maximum loop number, the step S180 is performed again.

The steps S180 to S220 are defined as a second erase loop. The steps S110 to S 170 are defined as the first erase loop. Summation of the performance number of the first erase loop and the performance number of the second erase loop are defined as the number N of the erase loop performed presently in the step S220.

As described above, if the fail count Fail_count of the current erase loop is higher than that of the previous erase loop, the controller 160 determines that the threshold voltage of the memory cell increases because electric charges are discharged through a blocking dielectric layer due to excessive increase of the erase voltage. The controller 160 reduces the erase voltage based on the determined result, and performs new erase loop by using the reduced erase voltage. Accordingly, the threshold voltages of the memory cells are erased to a voltage lower than the target threshold voltage, and thus, error of the erase operation is inhibited.

Figure 5:
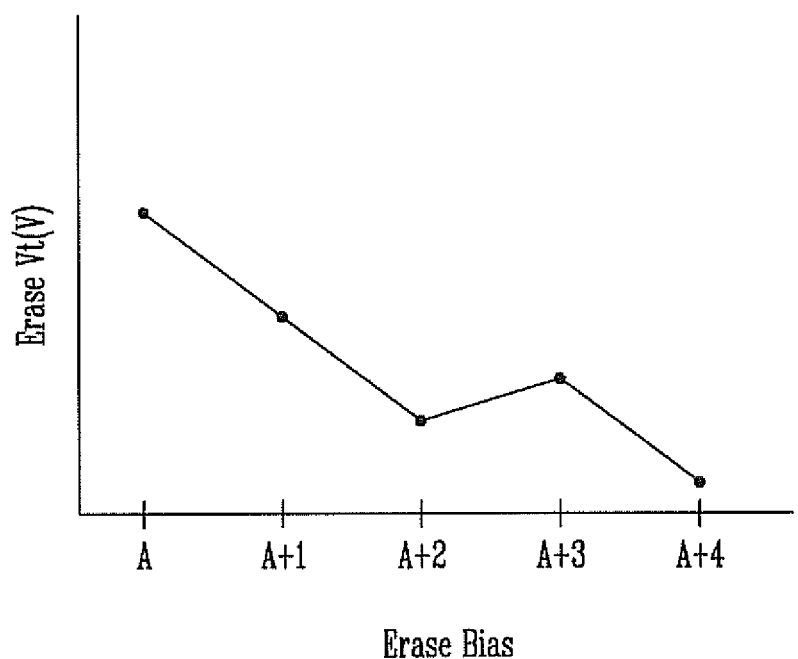
FIG. 5 is a view illustrating a graph of showing threshold voltage change in an erase operation of a semiconductor memory device according to an embodiment of the present invention.

FIG. 5 is a view illustrating a graph of showing threshold voltage change in an erase operation of a semiconductor memory device according to an exemplary embodiment of the present invention.

In FIG. 5, in case that the erase voltage is changed from A to A+4 by repeating the erase operation, the threshold voltage of the memory cell reduces until an operation of supplying an erase voltage becomes A+2, However, in case that the threshold voltage increases due to excessive erase voltage in an operation of supplying an erase voltage A+3, the fail count is augmented. In case that the fail count is higher than that of previous erase loop, new erase loop is performed by using new erase voltage (A+4), which is lower than the erase voltage (A+3), thereby downing the threshold voltage of the memory cell.

Although embodiments have been described with reference to a number of illustrative embodiments thereof, it should be understood that numerous other modifications and embodiments may be devised by those skilled in the art that will fall within the spirit and scope of the principles of this disclosure.

What is claimed is:

1. A semiconductor memory device, comprising:
a memory cell block including a plurality of memory cells;
a peripheral circuit section configured to perform an erase loop including a supply operation supplying an erase voltage and an erase verification operation to erase data stored in the memory cells;
a fail bit counter configured to generate a fail count by counting the number of memory cells not erased in an erase operation among the memory cells; and
a controller configured to control the peripheral circuit section to perform a first erase voltage applying operation using a first erase voltage obtained by increasing the erase voltage when the fail count generated by the fail bit counter is smaller than a previous fail count as a result of comparing the fail count with the previous fail count, and perform a second erase voltage applying operation using a second erase voltage obtained by decreasing the erase voltage and a new erase verification operation when the fail count is greater than or equal to the previous fail count. wherein the controller re-performs the second erase voltage applying operation by using a new second erase voltage obtained by decreasing the second erase voltage when it is determined that the new erase verification operation is failed.

2. The semiconductor memory device of claim 1, wherein the memory cells are charge trap type memory cells.

3. The semiconductor memory device of claim 1, wherein the peripheral circuit section includes:

a voltage generation section configured to generate the erase voltage and to supply the erase voltage to a p-well of the memory cell block; and
a page buffer section configured to sense threshold voltages of the memory cells and verify the erase operation based on a result of the erase verification operation.

4. The semiconductor memory device of claim 3, wherein the page buffer section determines that the erase operation fails when a threshold voltage of at least one of the memory cells is higher than a given threshold voltage.

5. The semiconductor memory device of claim 1, further comprising a loop counter configured to count the number of times the erase loop is perforated to generate a loop count signal.

6. The semiconductor memory device of claim 5, wherein the controller finishes the erase operation when the number of times a current erase loop is performed exceeds a given maximum loop number in response to the loop count signal.

7. The semiconductor memory device of claim 1, wherein the controller includes:
a register configured to store the fail count of the previous erase loop; and
a comparison circuit configured to compare the fail count of the previous erase loop stored in the register with a fail count of a current erase loop.

8. The semiconductor memory device of claim 7, wherein the controller determines whether or not the fail count of the current erase loop increases or decreases by comparing the fail count of the current erase loop outputted from the fail bit counter with the fail count of the previous erase loop stored in the register.

9. The semiconductor memory device of claim 8, wherein the controller is configured to set the new first erase voltage by increasing the erase voltage by the first step voltage when the fail count of the current erase loop is less than that of the previous erase loop, and the controller is configured to set the new second erase voltage by decreasing the erase voltage by the second step voltage when the fail count of the current erase loop is greater than that of the previous erase loop.

10. The semiconductor memory device of claim 1, wherein the second step voltage is lower than or equal to the first step voltage.

11. A method of operating a semiconductor memory device, the method comprising:
supplying an erase voltage to a p-well of a semiconductor substrate on which memory cells are formed;
performing a first erase verification operation on the memory cells;
generating a fail count by counting the number of memory cells not erased in an erase operation among the memory cells;
comparing the fail count with a previous fail count;
setting a first erase voltage by increasing the first erase voltage by a first step voltage when the fail count is less than the previous fail count, and returning to an operation supplying the first erase voltage and repeating the operation supplying the first erase voltage and following operations using the first erase voltage;
setting a second erase voltage by decreasing the first erase voltage by a second step voltage when the fail count is greater than or equal to the previous fail count;
supplying the second erase voltage to the p-well;
performing a second erase verification operation on the memory cells; and
decreasing the second erase voltage by the second step voltage when the result of the second erase verification operation is determined as fail, and returning to an operation supplying the second erase voltage and repeating the operation supplying the second erase voltage and following operations using the second erase voltage.

12. The method of claim 11, wherein the result of the first erase verification operation is determined as fail if at least one of the memory cells has failed.

13. The method of claim 11, further comprising counting a current erase loop number before the fail count is generated, when the result of the first erase verifying operation is determined as fail, and finishing the erase operation when the current erase loop number is less than or equal to a given maximum loop number.

14. The method of claim 11, wherein the second step voltage is lower than or equal to the first step voltage.

15. The method of claim 11, further comprising counting a current erase loop number before the second erase voltage is set when the result of the second erase verifying operation is determined as fail, and finishing the erase operation if the current erase loop number is less than or equal to a given maximum loop number.

16. The method of claim 11, wherein the memory cells are charge trap type memory cells.

\* \* \* \* \*